US006871330B2

(12) United States Patent
Flatresse et al.

(10) Patent No.: US 6,871,330 B2
(45) Date of Patent: Mar. 22, 2005

(54) METHOD AND DEVICE FOR CHARACTERIZING A CMOS LOGIC CELL TO BE PRODUCED IN A TECHNOLOGY OF THE PARTIALLY DEPLETED SILICON-ON-INSULATOR TYPE

(75) Inventors: Philippe Flatresse, Froges (FR); Mario Casu, Turin (IT)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/447,776

(22) Filed: May 29, 2003

(65) Prior Publication Data

US 2004/0054514 A1 Mar. 18, 2004

(30) Foreign Application Priority Data

May 30, 2002 (FR) .......................................... 02 06650

(51) Int. Cl.[7] .............................................. G06F 17/50
(52) U.S. Cl. ...................... 716/4; 716/5; 716/6; 703/13; 703/14; 703/15; 327/51; 327/536
(58) Field of Search ........................ 716/4–6; 32/51–57, 32/536; 703/13–15

(56) References Cited

U.S. PATENT DOCUMENTS

| 6,779,161 B1 | * | 8/2004 | Poiroux et al. ................. 716/4 |
| 6,781,421 B2 | * | 8/2004 | Terzioglu et al. ............. 327/51 |
| 2004/0119525 A1 | * | 6/2004 | Shor et al. ................... 327/536 |

OTHER PUBLICATIONS

Das et al., "Circuit Style Comparison Based on Teh Variable Voltage Transfer Characteristic and Floating Beta Ratio Concept of Partially Depletion SOI," IEEE, 2001, pp. 1–2.*

Su et al., "Studying the Impact of Gate Tunneling on Dynamic Behaviors of Partially–Depleted SOI CMOS Using BSIMPD," IEEE, 2002, pp. 1–5.*

Yi et al., "Analytical Model for a Transient Floating Body Voltage in PD–SOI MOSFETs," IEEE, 2002, pp. 53–54.*

Kuo, "Spice Compact Modeling of PD–SOI CMOS Devices," IEEE, 2000, pp. 1–4.*

Aller et al., *Detailed Analysis of the Gate Delay Variability in Partially Depleted SOI CMOS Circuits*, SOI Conference, 1999, Proceedings, 1999 IEEE International, Rohnert Park, CA, Oct. 4–7, 1999, pp. 40–41, XP010370224.

Shepard et al., *Body–Voltage Estimation in Digital PD–SOI Circuits and its Application to Static Timing Analysis*, Computer Aided Design, 1999, Digest of Technical Papers, 1999 IEEE/ACM International Conference, San Jose, CA, Nov. 7–11, 1999, pp. 531–538, XP010363841.

Xilin et al., *SOI Device and Technology: Modeling, Characterizing, and Stimulations*, 2001 6th International Conference on Solid–State and Integrated Circuit Technology, (Cat. No. 01EX443), Proceedings of 6th International Conference on Solid–State and IC Technology, Shanghai, China, Oct. 22–25, 2001, pp. 643–649, vol. 1, XP010576049.

* cited by examiner

*Primary Examiner*—Vuthe Siek
(74) *Attorney, Agent, or Firm*—Lisa K. Jorgenson; Allen, Dyer, Doppelt, Milbrath & Gilchrist, P.A.

(57) ABSTRACT

A method for characterizing a CMOS logic cell of the partially depleted silicon-on-insulator type (PD-SOI) may include modeling the logic cell and determining internal potentials of transistors of the cell in a dynamic equilibrium state based upon a functional simulation of the modeled cell. This may be done using a binary stimulation signal having an initial logic value. The dynamic equilibrium state may be based upon a cancellation, to within a precision error, of the sum of the squares of variations in the quantities of charge in floating substrates of the transistors taken over a period of two successive transitions of the stimulation signal.

27 Claims, 8 Drawing Sheets

METHOD AND DEVICE FOR CHARACTERIZING A CMOS LOGIC CELL TO BE PRODUCED IN A TECHNOLOGY OF THE PARTIALLY DEPLETED SILICON-ON-INSULATOR TYPE

FIELD OF THE INVENTION

The invention relates to integrated circuits, and, more particularly, to the CMOS logic circuits. Moreover, the invention relates to the behavior of CMOS logic circuits produced using partially depleted silicon-on-insulator (PD-SOI) technology, and to the characterization of such circuits, for example, with respect to time delay.

BACKGROUND OF THE INVENTION

In recent years, SOI technology has proved to be a particularly useful alternative to conventional CMOS technology using bulk silicon. More particularly, the so-called "floating substrate" effects in SOI technology, which are well known to those skilled in the art, and the reduction in junction capacitances are two examples of the improved performance provided by SOI technology. However, the floating substrate effects have disadvantages.

One such disadvantage is the hysteresis effect in the threshold voltage of a transistor, which is manifested by variations in time delay. That is, variations occur in the time of propagation of a signal between the input and the output of a logic cell having such transistors, e.g., an inverter.

PD-SOI technology introduces a "temporal" dependence of the delays in such a way that the same structure may have different delays from cycle to cycle when its rate is clocked by a clock signal. A method of initializing the voltage on the floating substrate is generally used in the design of SOI circuits, and error tolerances are used to take these time constraints into account. However, such an approach may result in the performance of the structure that is produced being overestimated or underestimated.

Moreover, not only do worse case delays need to be known, but the delays in the best case situations need to be known so that synchronization problems may be accounted for. Yet, both the worse and best cases are difficult to identify since process and design parameters such as current gain, input slope, charge, supply, and temperature play a key role. Furthermore, the variable nature of the threshold voltages in PD-SOI devices is such that the propagation of a given transition between the input and the output of a logic cell leads to a different delay depending on whether the cell is under static equilibrium (DC) conditions or whether a dynamic equilibrium (steady state AC) state has been reached.

Additionally, in practice it proves to be substantially impossible to characterize a logic cell by exhaustive simulations. This is because several thousands of cycles, and therefore several hours of simulation, are needed to reach dynamic equilibrium in the case of simple inverter-type cells. As such, the characterization of a much more complex cell is essentially inconceivable using this method.

SUMMARY OF THE INVENTION

It is an object of the invention to allow rapid evaluation of time delays in a dynamic equilibrium state, as well as rapid evaluation of delays under best and worse case scenarios, for both simple and relatively complex CMOS logic cells formed using PD-SOI technology.

The invention therefore provides a method of characterizing a CMOS logic cell to be produced using PD-SOI technology. The method may include modeling the cell, for example, using a BSIM3SOI transistor model, and determining the internal potentials (or potentials of the floating substrates) of the transistors of the cell in a dynamic equilibrium state. Such determination may be based on a functional simulation of the modeled cell using a binary stimulation signal having an initial logic value. The internal potentials are determined based upon a cancellation point of the potentials to within a precision error. The cancellation may be determined based upon the sum of the squares of the variations in the quantities of charge in the floating substrates over a period of two successive transitions of the stimulation signal.

In other words, the invention is based upon the observation that the dynamic equilibrium state (i.e., steady state) may be defined as the operating point at which the internal potential of the transistors no longer varies between two successive transitions. That is, the operating point is where the charge variation is zero in the floating substrate.

According to one aspect of the invention, the determination of the internal potentials of the transistors of the cell in the dynamic equilibrium state may be performed iteratively and until the cancellation of the sum over a period of the stimulation signal is obtained. This may include functionally simulating the modeled cell, and delivering for a current period of the stimulation signal the variations in the quantities of charge in the floating substrates based upon current values of the internal potentials. Further, an optimization may be performed for optimizing the values of the internal potentials, including the cancellation thereof, to within the precision error of an objective function equal to the above-noted sum.

In other words, it is advantageous to use a parameter optimizer whose engine is, for example, a Marquardt algorithm, which is used to determine the values of the internal potentials of the transistors when the charge variation is zero between two successive transitions (i.e., the dynamic equilibrium state). As an example, the algorithm may vary n internal potentials of n transistors of the cell in question to cancel the sum of the squares of the charge variations. The parameter optimizer therefore restores the optimized values of the internal potentials of the n transistors.

The method may furthermore include determining the internal potentials of the transistors of the cell in a static equilibrium state (i.e., before the first occurrence of a transition in the stimulation signal). The method may also include determining the difference between the respective rate of change of the internal potentials of the p-channel and n-channel transistors of the cell between the static equilibrium state and the dynamic equilibrium state that are obtained for the stimulation signal.

It may also be advantageous to determine the internal potentials of the transistors of the cell after the first and second transitions in the stimulation signal. It may similarly be advantageous to determine the internal potentials of the transistors corresponding to the best/worse time delay cases from the internal potentials of the transistors after the first and second occurrences, and from the internal potentials in the static equilibrium state, the dynamic equilibrium state, and from the difference in rates of change.

This is because the worst time delay case (or the best time delay case) could occur either after the first or second occurrence of the transition, either in the dynamic equilibrium state or between the first occurrence of the transition and the dynamic equilibrium state. Furthermore, it is the observation of the difference between the respective rates of change of the internal potentials of the p-channel and n-channel transistors that will allow the various cases to be distinguished.

It should also be noted here that the second occurrence of the transition is obtained from a stimulation signal having an initial logic value opposite to that of the stimulation signal, which allows the first occurrence of the transition to be obtained. When the cell includes at least two complementary transistors connected to at least one input of the cell, as is the case with an inverter, for example, the stimulation signal is applied to the input.

When the cell includes several pairs of complementary transistors connected to several inputs of the cell, such as in the case of a two-input NAND gate, for example, the stimulation signal is applied in succession to each of the inputs. Meanwhile, predetermined logic values are set for the other inputs to be delivered as outputs by the cell. The term "in succession" herein means that different successive simulations are carried out. For more complex cells, the cell is divided into elementary subcells and the internal potentials of the transistors of each elementary subcell in the dynamic equilibrium state is determined.

The determination of the difference in respective rates of change of the internal potentials of a p-channel transistor and of an n-channel transistor, the state of which varies in response to the stimulation signal, may be determined as follows. An initial slope may be determined of a curve representing the change between the static equilibrium state and the dynamic equilibrium of the internal potential of the p-channel transistor as a function of the internal potential of the n-channel transistor.

If the absolute value of this slope is close to 0, the internal potential of the p-channel transistor corresponding to the worse time delay case or to the best time delay case for this stimulation is obtained from the internal potential of the transistor in its static equilibrium state. The internal potential of the n-channel transistor corresponding to the worse time delay case for this stimulation is obtained from the internal potential of the transistor in its dynamic equilibrium state.

If the absolute value of the slope is substantially greater than 1, the internal potential of the n-channel transistor corresponding to the worse time delay case or to the best time delay case for this stimulation is obtained from the internal potential of the transistor in its static equilibrium state. The internal potential of the p-channel transistor corresponding to the worse time delay case for this stimulation is obtained from the internal potential of the transistor in its dynamic equilibrium state. If the absolute value of the slope is approximately equal to 1, the internal potentials of the transistors corresponding to the worse time delay case or to the best time delay case for this stimulation are obtained either from the respective internal potentials of these transistors after the first or second occurrence of the transition, or from the respective internal potentials of these transistors in the dynamic equilibrium state.

The method may also include determining the various time delays of the cell from the corresponding internal potentials, and determining the time delay corresponding to the worse case or to the best case for each stimulation. It is also possible to determine other parameters for characterizing the cell, such as for example, the consumption and the leakage current from the internal potentials of the transistors of the cell corresponding to the worse case or to the best case for each stimulation.

A device for characterizing a CMOS logic cell produced using PD-SOI technology in accordance with the invention may include a modeler or means for modeling the cell and a processor or processing means for determining the internal potentials of the transistors of the cell in their dynamic equilibrium state. This determination may be based on a functional simulation of the modeled cell using a binary stimulation signal, having an initial logic value. The internal potentials are determined based on a cancellation point of the potentials to within a precision error. The cancellation point may be determined based upon the sum of the squares of the variations in the amounts of charge in the floating substrates over a period of two successive transitions of the stimulation signal.

The processor may include a simulator or simulation means for performing a functional simulation of the modeled cell. The simulation means may deliver, for a current period of the stimulation signal, the variations in the amounts of charge in the floating substrates from the current values of the potentials of the floating substrates. The processor may further include an optimizer or optimization means for processing the values of the potentials of the floating substrates, including the cancellation thereof, to within the precision error of an objective function equal to the above-noted sum. The processor may also include and activator or activation means for activating the simulator and the optimizer iteratively and until the sum is cancelled over the period of the stimulation signal.

The processor may also determine the potentials of the floating substrates in a static equilibrium state. It may further determine the difference between the respective rates of change of the potentials of the floating substrates of the p-channel and n-channel transistors of the cell between the static equilibrium state and the dynamic equilibrium state for the stimulation signal.

The processor may additionally determine the internal potentials of the transistors of the cell after the first and second occurrences of a transition in the stimulation signal. It may also determine the internal potentials of the transistors corresponding to the worse or best time delay case of the cell. This may be done from the internal potentials of the transistors after the first and second occurrences, from the internal potentials in the static equilibrium state and in the dynamic equilibrium state, and from the difference in rates of change.

The processor may also determine the initial slope of a curve representing the change between the static equilibrium state and the dynamic equilibrium state of the internal potential of a p-channel transistor as a function of the internal potential of an n-channel transistor. If the absolute value of the slope is close to 0, the internal potential of the p-channel transistor corresponding to the worse time delay case or to the best time delay case for this stimulation is obtained from the internal potential of the transistor in its static equilibrium state. The internal potential of the n-channel transistor corresponding to the worse time delay case for this stimulation is obtained from the internal potential of the transistor in its dynamic equilibrium state.

If the absolute value of this slope is substantially greater than 1, the internal potential of the n-channel transistor corresponding to the worse time delay case or to the best time delay case for this stimulation is obtained from the internal potential of the transistor in its static equilibrium state. The internal potential p-channel transistor corresponding to the worse time delay case for this stimulation is obtained from the internal potential of the transistor in its dynamic equilibrium state.

If the absolute value of this slope is approximately equal to 1, the internal potentials of the transistors corresponding to the worse time delay case or to the best time delay case for this stimulation may be obtained as follows. First, this may be done from the respective internal potentials of these transistors after the first or second occurrence of the transition. It may also be done from the respective internal potentials of these transistors in the dynamic equilibrium state.

The processor may also determine the various time delays of the cell from the determined corresponding internal potentials, and also determine time delay corresponding to the best and worse cases for each stimulation. Moreover, the processor may determine other parameters for characterizing the cell from the internal potentials of the transistors of the cell corresponding to the best and worse cases for each stimulation.

BRIEF DESCRIPTION OF THE DRAWINGS

Other advantages and features of the invention will become apparent upon examining the detailed description of embodiments of the invention, which are given by way of non-limiting examples, and the appended drawings, in which.

DETAILED DESCRIPTION OF THE PREFERRED EMBODIMENTS

Figure 1:
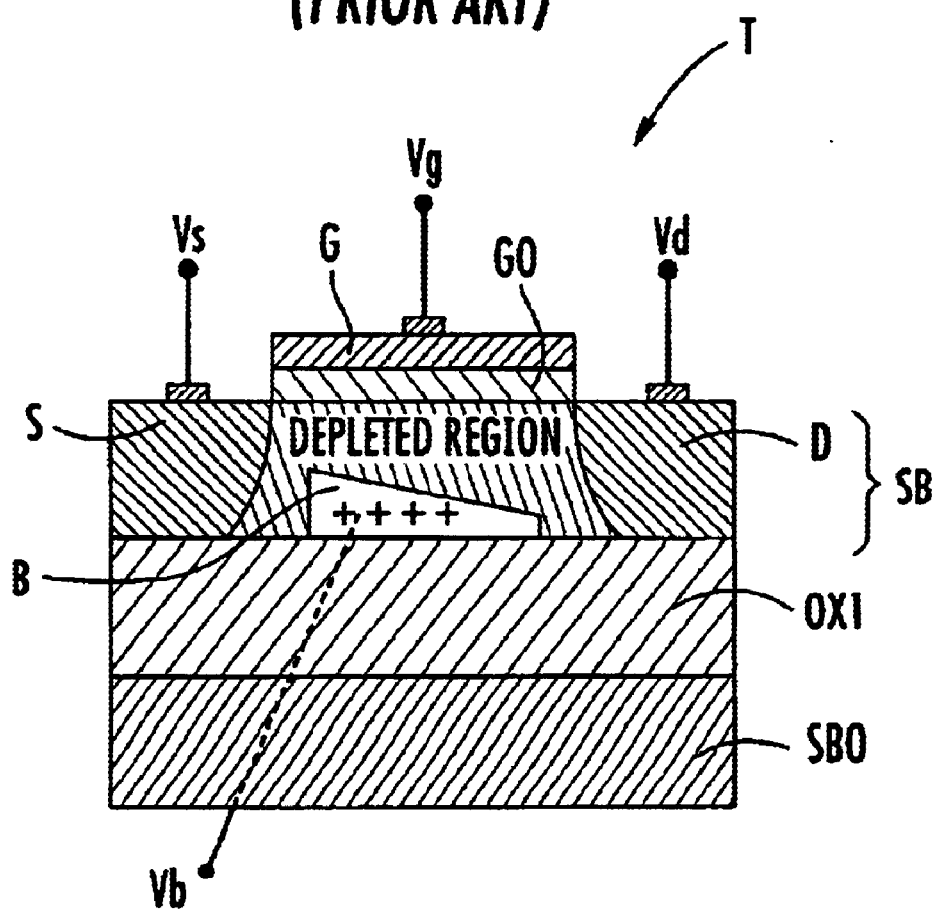
FIG. 1 is a schematic diagram illustrating a transistor implemented using partially depleted silicon-on-insulator technology in accordance with the prior art.

Turning now to FIG. 1, an nMOS transistor T is formed in a silicon substrate SB on an insulating layer OX1. The insulating layer OX1 itself is on a carrier substrate SBO. This structure is typical of an SOI structure, which is well known to those skilled in the art. When the thickness of the oxide layer OX1 is large enough (e.g., greater than about 50 nanometers), the substrate SB is of the partially depleted type.

In such a transistor, a neutral zone B lies beneath the depleted region and between the source and drain regions S and D. This neutral zone, which will collect holes, is not connected to a fixed potential. It is therefore referred to as a "floating substrate" zone. Of course, apart from this floating substrate zone, the transistor T conventionally includes the source region S, the drain region D and a gate region G, that latter being isolated from the substrate SB by a gate oxide GO.

The variations in the internal potential Vb of the transistor T, i.e., of the potential of the floating substrate BN, are caused in particular by the source/gate/drain capacitive coupling and by impact ionization, generation/new combination effects and gate tunnel effects. These variations in the internal potentials result in variations in the threshold voltage and variations in the leakage and saturation occurrence of the transistor.

Figure 2B:
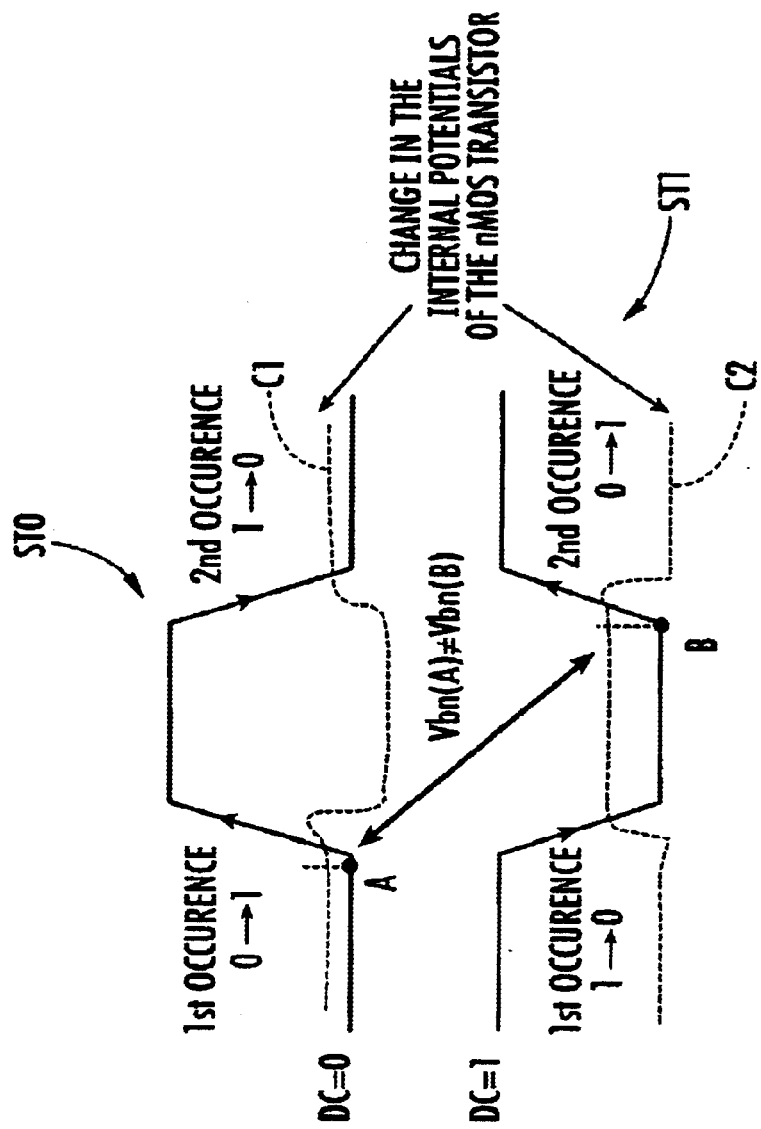
FIGS. 2a and 2b are, respectively, a schematic circuit diagram of a CMOS inverter cell and a graph illustrating the change in the internal potentials of the nMOS transistor of the inverter cell in accordance with the prior art.
Figure 2A:
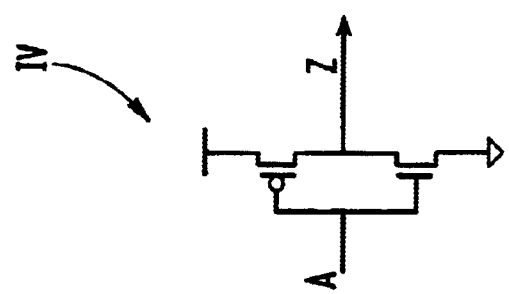

Moreover, the structures in partially depleted SOI devices exhibit "history effects" which are manifested by a time dependence of the delays. More particularly, the recent history of an input terminal has an impact on the performance. This is illustrated in particular with respect to FIGS. 2a and 2b for an inverter IV having an input A and an output Z. A curve C1 illustrates the change in the internal potential of the nMOS transistor of the inverter IV in response to a binary stimulation signal ST0 having the logic value 0 as an initial value.

A curve C2 illustrates the same change in the internal potential of the nMOS transistor of the inverter IV in response to a stimulation signal ST1 having the logic value 1 as initial value. To observe the first occurrence of the 0/1 transition and the second occurrence of the 0/1 transition, it is necessary to use the two stimulation signals ST0 and ST1. The same applies for observing the first occurrence of the 1/0 transition and the second occurrence of the 1/0 transition.

In SOI technology, as in bulk silicon technology, the rise times are different from the fall times on the output Z. However, in SOI technology, the first occurrence and the second occurrence of the same transition do not result in the same internal potentials, and consequently do not have the same time delays. This is due to the variations in the potential of the neutral zone BN, which has different values depending on whether the potential is in a static equilibrium situation (situation A), or whether it has undergone a recent transition and has not had the time to resume an equilibrium state (situation B).

The dynamic equilibrium state (steady state) may be defined as the operating point at which the internal potential of the transistors no longer varies between two successive transitions of the stimulation signal. That is, the variation in charge is zero in the neutral zone BN. At this stage, the charges entering the neutral zone (via the leakage current from the reverse-biased neutral zone/drain junction and via an impact ionization phenomenon) are equal to the charges leaving via the now conducting neutral zone/source junction.

Figure 3B:
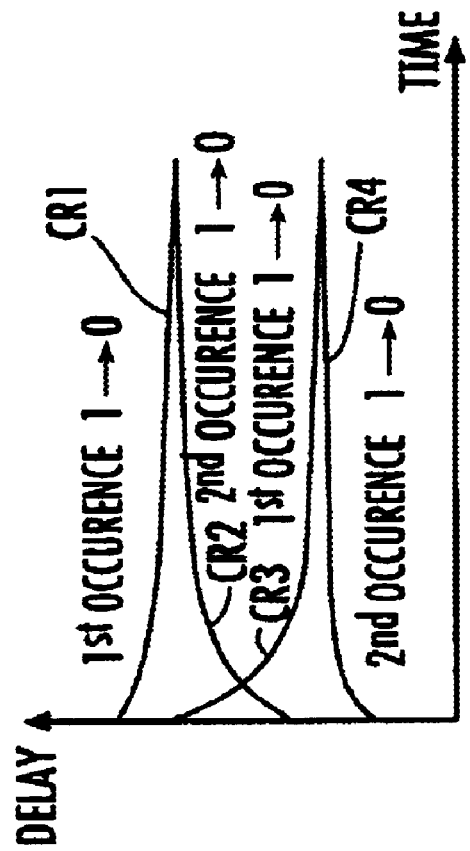
FIGS. 3a and 3b are, respectively, graphs illustrating stimulation signals and a corresponding delay of the internal potential changes versus time based thereon in accordance with the present invention.
Figure 3A:
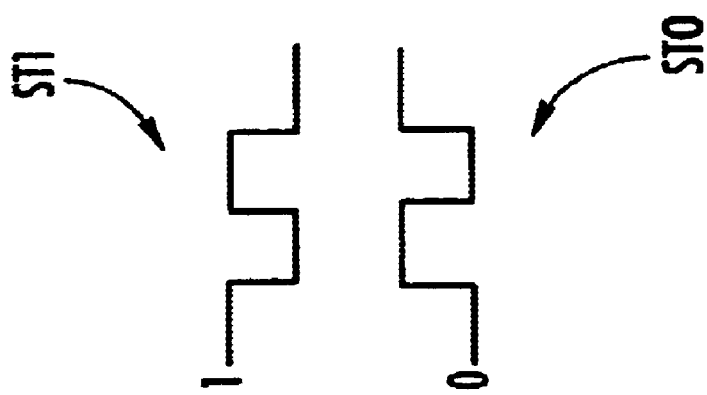

If a large number of pulses is sent to the input of a logic cell (e.g., an inverter) using the stimulation signal ST1 (which starts the logic 1 condition), and then the stimulation signal ST0 (which starts the logic zero condition), the following may be observed. Namely, as illustratively shown in FIGS. 3a and 3b, the delays corresponding to the first and second occurrences of the same transition converge (curves CR1 and CR2 on the one hand, and curves CR3 and CR4 on the other). Two different dynamic equilibrium states are obtained for the two stimulation signals, i.e., for two different initial logic values.

Figure 4:
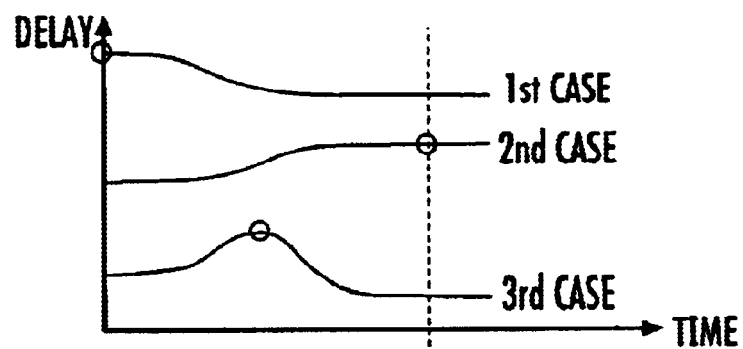
FIG. 4 is a graph illustrating three possible changes in the propagation delay in a logic cell as a function of time in accordance with the present invention.

Likewise, the four time delays corresponding to the first and second occurrences of the 1/0 transition and to the first and second occurrences of the 0/1 transition, respectively, are different. It will therefore be necessary to determine them, as well as the time delays corresponding to the two dynamic equilibrium states, to be able to determine the time delay in the worse case situation and/or in the best case situation. This is because, in a partially depleted SOI device, the worse case (or best case) time delay may be during the first occurrence of a transition (first case), in the dynamic equilibrium state (second case), or somewhere between the two (third case) for a given stimulation signal (i.e. one having a given initial logic value), as illustrated in FIG. 4.

In theory, the dynamic equilibrium state is achieved after several hundred thousand pulses on the input of the gate in question. This represents a simulation time of a dozen hours or so for a simple inverter, and is consequently practically impossible to simulate for a more complex cell. The present invention makes it possible to solve this problem and especially to determine very rapidly the internal potentials of the transistors of a logic cell in their dynamic equilibrium state.

Figure 6:
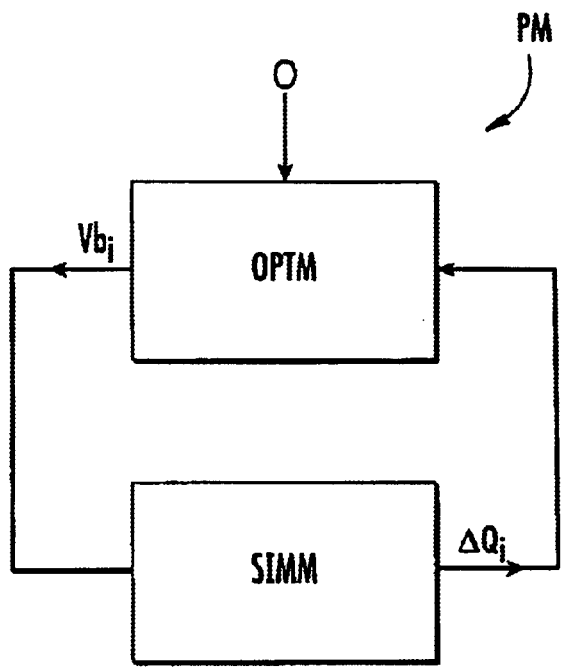
FIG. 6 is a schematic block diagram of a characterization device for determining the internal potential in the dynamic equilibrium state of the transistors of a CMOS cell in accordance with the present invention.

In this regard, to characterize a logic cell an appropriate transistor model is used. By way of example, one suitable model, namely BSIM3SOI, is available on the University of Berkeley Internet site. Another suitable model (SOISPICE) is available from the University of Florida. The model is then used with a processor PM (FIG. 6) for determining the internal potentials Vb of the transistors of the cell in their dynamic equilibrium state.

Figure 5:
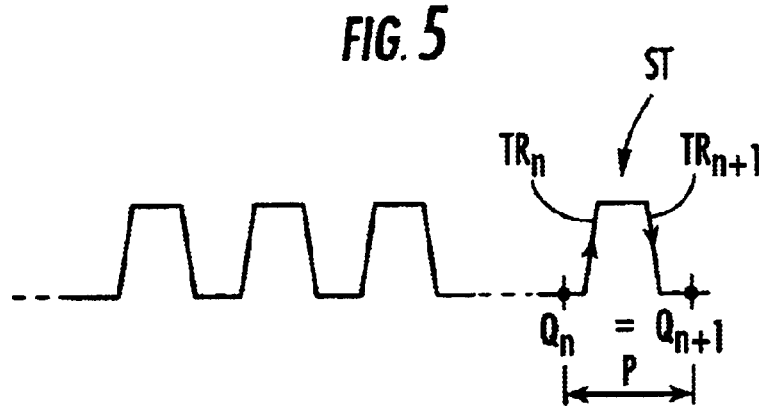
FIG. 5 is a graph illustrating a stimulation signal in accordance with the present invention.

This determination is based on cancellation, to within a precision error, of the sum of the squares of the variations in the amounts of charge in the floating substrates over a period P (FIG. 5). The period P encompasses two successive transitions TRn and TRn+1 of a stimulation signal ST during a functional simulation of the modeled cell. This functional simulation may be carried out by a software simulator SIMM using, for example, simulation software known by the name ELDO from Mentor Graphics.

Thus, the input parameters for the modeled cell and for the simulator SIMM (e.g., ELDO) are as follows: the value of the source voltage; the definition of the gate and the drain as input and output of the inverter; the value of the internal potentials of the transistors; the value of the voltage of the substrate SB, e.g., taken at zero; the value of the slopes of the transitions of the simulation signals; and the value of the charging capacitors.

The simulator SIMM delivers as an output the quantities of charge in the floating substrates BN of the transistors together with the delay in consumption values. The determination of the internal potential in the dynamic equilibrium state of the transistors is carried out by combining the simulator SIMM with a parameter optimizer OPTM. By way of example, the optimizer OPTM may implement a Marquardt algorithm, such as that described in the article by D. Marquardt entitled *"An algorithm for at least square estimates of non linear parameters"*, SIAM Journal, Vol. 11, p. 431–441, 1963.

In the present case, the optimization processing carried out by the optimizer OPTM will include canceling, to within a precision error, an "objective" function. This function is equal to the sum of the squares of the variations in the quantities of charge in the floating substrates over the period P. In practice, determination of the parameters Vb of the transistors is carried out iteratively. More specifically, for a given stimulation signal having a given initial logic value, an activator and accompanying software will activate the simulator SIMM. The optimizer OPTM will also be iteratively activated until the sum over a period of the stimulation signal is cancelled.

More specifically, at each period of the stimulation signal, the simulator SIMM will deliver, on the basis of the values of the internal potentials $Vb_i$ delivered by the optimizer OPTM at the previous cycle, the various charge variations $\Delta Q_i$ of the transistors. These charge variations $\Delta Q_i$ are processed by the optimizer OPTM, which will vary the values of the internal potentials for the purpose of canceling the objective function to within a precision error. When the objective function has been cancelled to within the precision error, the values of the internal potentials $Vb_i$ delivered by the optimizer OPTM are the values of the internal potentials in the dynamic equilibrium state of the transistors.

To simplify matters, it may be stated that the optimization algorithm varies the internal potentials of the transistors of the cell in question to cancel the sum of the squares of the charge variations. The optimizer then delivers the optimized values of the internal potentials, which are in turn used again by the simulator SIMM to determine the time delay corresponding to the dynamic equilibrium state.

It should be noted here that such processing to determine the internal potentials in the dynamic equilibrium state takes about two minutes for an inverter, compared with about 24 hours for a conventional theoretical simulation. If a conventional simulation were to be carried out, the determination of the time delay in a worse or best case situation would prove to be very difficult if such situation was between the dynamic equilibrium state and the static equilibrium state. This is because the worse or best case situation may lie within a time scale completely inaccessible by conventional simulation. That is, such case may require a very large number of pulses, and consequently an extremely long simulation time.

The present invention also provides a solution to this problem and makes it possible for the internal potentials of the transistors in a worse or best case situation to be rapidly and simply determined. This may be done even if this situation lies between the static equilibrium state and the dynamic equilibrium state.

More specifically, it has been observed that when the worse or best case situation occurs neither during the first occurrences of the transitions nor in dynamic equilibrium, the change in time delay for a given stimulation signal starting from a given logic value passes through an intermediate maximum. This intermediate maximum is between the first transition and the dynamic equilibrium state, and it corresponds to the worse case situation.

Moreover, for the opposite stimulation signal, i.e., starting from the opposite logic value, the time delay then passes through an intermediate minimum between the first transition and the dynamic equilibrium state. This is the best case situation.

It has been observed that this type of situation occurs under extreme operating conditions of the cell, i.e., when applying a relatively shallow input slope and/or a high charging capacitance with respect to the cell in question. In the other cases, namely balanced operating conditions (i.e., the slope applied at the input and charging capacitor has reasonable values relative to the size of the cell in question), there is generally a substantially monotonic variation in the time delay as a function of time.

Under the extreme conditions, it is therefore observed that the internal potentials of the n-channel and the p-channel transistors do not reach the dynamic equilibrium state at the same time. This is because the internal potential of the nMOS transistor moves much more rapidly toward the equilibrium state than the internal potential of the pMOS transistor. On the other hand, under balanced operating conditions, the internal potentials of the two transistors generally move at the same rate.

Figure 7:
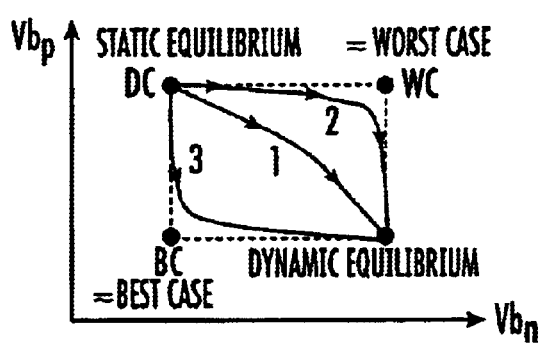
FIG. 7 is a graph illustrating best and worse case time delay determination in accordance with the present invention.

The curves illustrated in FIG. 7, which represent the internal potential $Vb_p$ of the pMOS transistor as a function of the internal potential $Vb_n$ of the nMOS transistor, show the difference in the rate of change of these two potentials toward the dynamic equilibrium state. More specifically, path 1 shows the change in the internal potentials of the nMOS transistor and of the pMOS transistor from the static equilibrium condition DC to the dynamic equilibrium (steady state) for an inverter used under balanced operating conditions. It may be seen that the internal potentials $Vb_n$ and $Vb_p$ change approximately at the same rate, which corresponds to a monotonic variation in the delay from the static equilibrium to the dynamic equilibrium.

In contrast, path 2 characterizes the situation in which the internal potential $Vb_n$ first changes much more rapidly than the internal potential $Vb_p$. This is therefore the situation in which a maximum delay (or minimum delay, depending on the logic value at the start of simulation) lies between the static equilibrium and the dynamic equilibrium.

In this case, an excellent approximation of this worse case (or best case) delay is the point WC on the curve. The point WC has as its coordinates the value of the internal potential $Vb_n$ in the dynamic equilibrium state, and the value of the internal potential $Vb_p$ in the static equilibrium state. It then suffices to initiate a simulation with the simulator SIMM using these internal potential parameters as initial conditions for obtaining the corresponding time delay.

For clarity of illustration, a path 3 is also illustratively shown for a situation in which the internal potential $Vb_p$ first changes much more rapidly than the internal potential $Vb_n$. That is, this is the situation in which a minimum delay (if the point WC corresponds to a worse case) or maximum delay (if the point WC corresponds to a best case) lies between the static equilibrium and the dynamic equilibrium. In this case, an excellent approximation of this best case (or worse case) delay is the point on the curve called BC. The point BC has as its coordinates the value of the internal potential $Vb_p$ in the dynamic equilibrium state, and the value of the internal potential $Vb_n$ in the static equilibrium state.

It may be seen that the paths 1, 2 and 3 are distinguished by the value of the initial slope of the curve representing the change, between the static equilibrium state and the dynamic equilibrium state, of the internal potential of a p-channel transistor as a function of the internal potential of an n-channel transistor. More specifically, a slope close to 0 corresponds to path 2, a slope approximately equal to 1 corresponds to path 1 and a slope substantially greater than 1 corresponds to path 3.

In practice, to determine this slope, a simulation is initiated over a small number of cycles (e.g., about 10), which makes it possible to obtain a first variation in the internal potentials $Vb_n$ and $Vb_p$ from the static equilibrium state for a given stimulation signal. The variation in these same internal potentials between the static equilibrium state and the dynamic equilibrium state is also known. A normalized ratio of these variations allows the value of the slope to be deduced therefrom.

Figure 8:
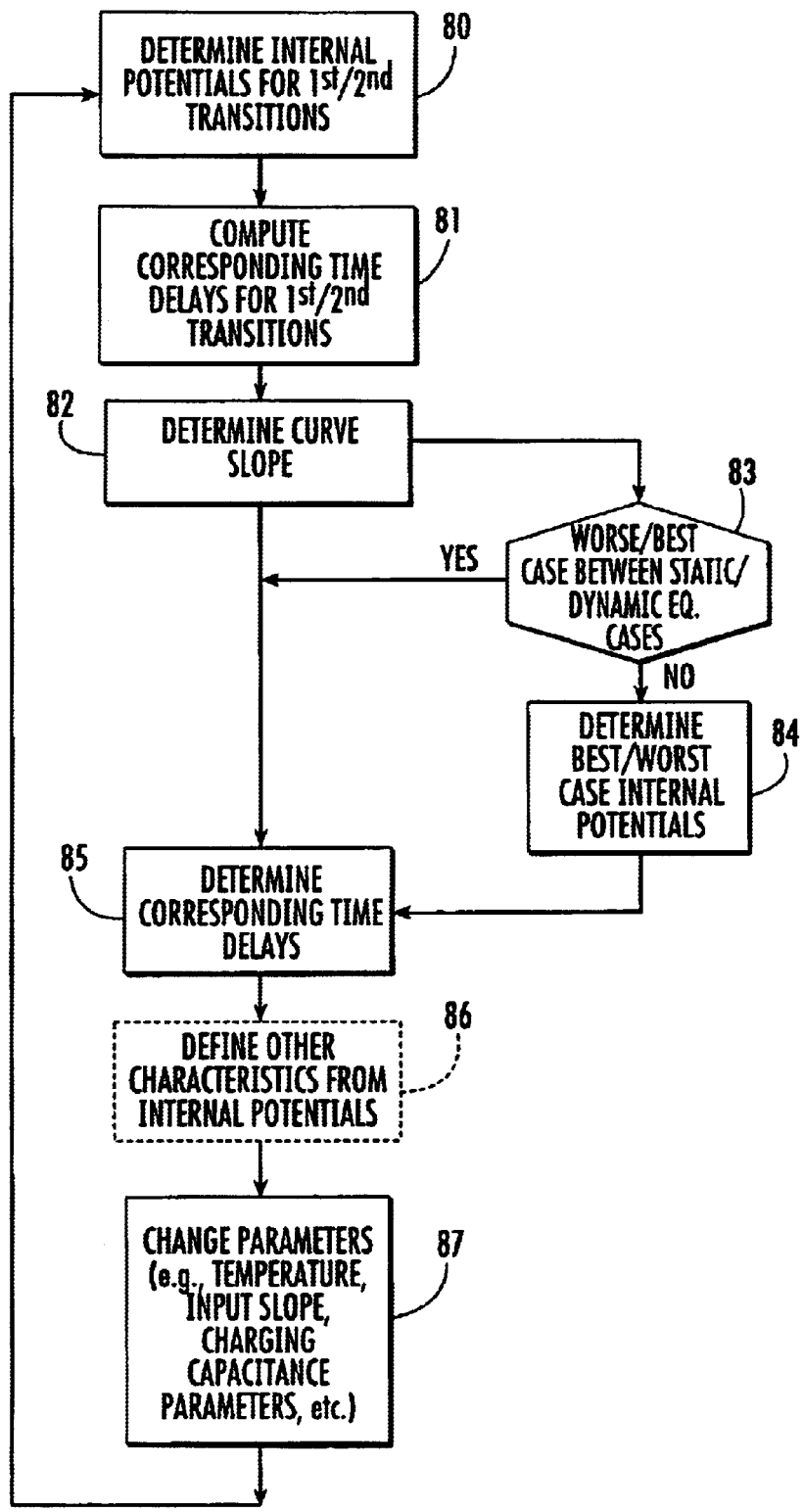
FIG. 8 is a flow diagram of the operation of a characterization device according to the present invention.

A flowchart for characterizing a logic cell in accordance with the present invention is illustratively shown in FIG. 8. In step 80, for each stimulation signal (starting from the two opposite logic values), the internal potentials of the transistors of the cell in question during the first and second occurrences of each transition are determined. The internal potentials of the transistors in their static equilibrium state and in their two dynamic equilibrium states corresponding to the two stimulation signals are also determined.

Next, from these internal potentials, the simulator computes, in step 81, the corresponding time delays. The processor determines, in step 82, the value of the slope of the curve representing the difference in the rate of change between the internal potentials of the p-channel transistors and the n-channel transistors.

If the situation is not one in which the worse case or the best case lies between the static equilibrium state and the dynamic equilibrium state (step 83), the internal potentials of the transistors in this worse case (or best case) are then determined (step 84), and the corresponding time delays are then deduced (step 85) therefrom. On the other hand, if this is not the situation, the time delays corresponding to the best and worse cases are then determined (step 85) from the delays computed for the first and second occurrences of each of the transitions. They are also determined for the two dynamic equilibrium states corresponding to the two opposite logic values of the simulation signals.

Next, in step 86 it is also possible to define other characteristics of the cell from the internal potentials, such as the consumption, the leakage current, etc. The cycle can be restarted (step 87) by changing the temperature, the input slope, the charging capacitance parameters, etc.

Figures 9A, 9B, 9C:
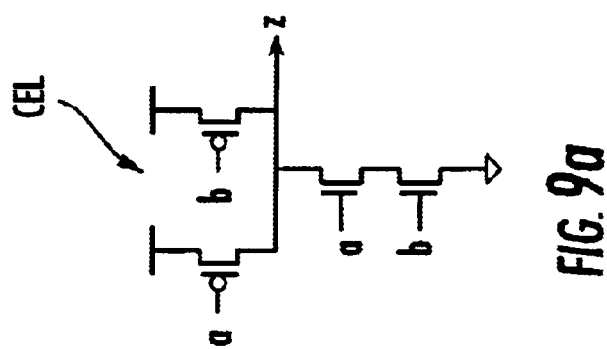
FIGS. 9a, 9b, and 9c are, respectively, a schematic diagram of a two-input logic cell and associated logic and delay tables illustrating implementation of the present invention for the two-input logic cell.

The characterization of a more complex cell than an inverter may, of course, be longer than that of the inverter. For example, a cell may include several inputs, such as the NAND cell CEL illustrated in FIG. 9a which has two inputs. It is therefore necessary to determine the internal potential, and consequently the time delays, for the first and second occurrences, as well as for the dynamic equilibrium state relating to the transitions of each of the inputs while the others are fixed. However, everything that was described above in the case of the inverter still applies to the characterization of such complex cells.

This being the case, it may be necessary to apply signals that cause switching of the output. To do this, reference is made to the truth table of FIG. 9b. It may be seen that if the input a is set at 0, the output of the CEL gate will remain unchanged whatever the value applied to the input b. Likewise, if the input b is set at 0, the output z of the cell will remain unchanged whatever the value applied to the input a.

Under these conditions, the input a will be set to 1 and the transitions on the input b will be examined in succession. Likewise, the input b will then be set to 1 and the transitions on the input a will be examined. This is summarized in the table of FIG. 9c.

Figures 10A, 10B:
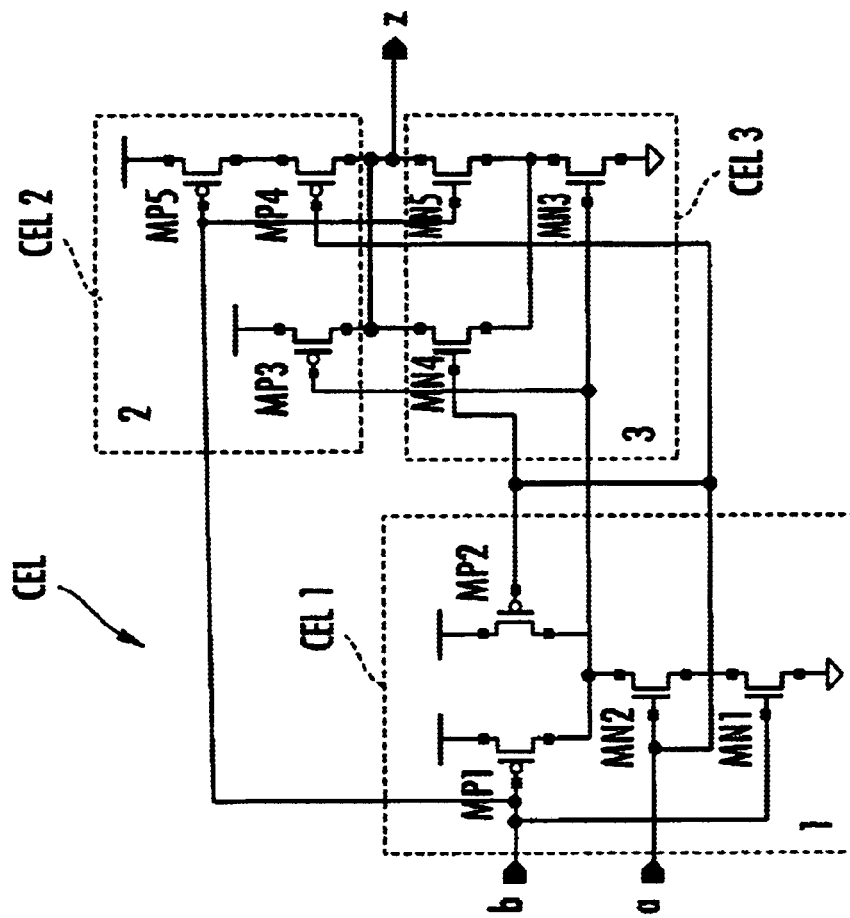
FIGS. 10a and 10b are, respetively, a schematic diagram of a more complex logic circuit and associated logic table illustrating implementation of the present invention therefor.

In the case of more complex cells, such as an EXCLUSIVE-NOR (XNOR) cell like that illustrated in FIG. 10a, for example, the number of transistors to be characterized may rapidly become a limiting factor in the case of certain optimization algorithms. If this is the case, the cell CEL may then be divided into several simpler elementary subcells. The combination of all the internal dynamic equilibrium potentials of these subcells, calculated separately, correspond to the overall dynamic equilibrium state of the entire cell.

Thus, in the example illustrated in FIG. 10a, the subcell CEL 1 is a simple NAND gate with two inputs, the characterization of which is may be performed by the optimization algorithm described above. An optimization will therefore be initiated on the cell CEL by considering first only the internal potentials of the transistors belonging to the subcell CEL 1. The same will then apply to the subcells CEL 2 and CEL 3.

This process will be further understood with reference to the truth table of FIG. 10b. For the transition t0, the input a does not vary and remains set at 0, which means that the output of the subcell CEL 1 is set to 1. Consequently, the internal potentials of the transistors making up the subcell CEL 1 are not involved in the search for the dynamic equilibrium state corresponding to the t0 transition. This will therefore involve only the optimization of the transistors MN3, MN4, MN5, MP3, MP4 and MP5.

More specifically, by setting the input a to 0 and by applying the 0/1/0 transition to the input b, the transistors MP5 and MN3 are initially on. The floating nodes of the circuit are then initially biased to a known potential, and the internal potentials of the transistors of the subcells CEL 2 and CEL 3 may then be properly optimized.

With regard to the t1 transition, the input b is set to 0, and the output of the subcell CEL 1 is set to 1. The transistor of this subcell CEL 1 will therefore not be involved. The transistor MN5 is also off throughout the transition. Its internal potential will therefore not be involved either. By applying the 0/1/0 transition, the output z (initially at 1) is pulled towards 0 via the nMOS transistors, thus allowing optimization of the internal potential. On the other hand, the 1/0/1 transition charges the output z to 1, while it was initially at 0, thus allowing optimization of the pMOS transistors of the subcell CEL 2.

The output of the subcell CEL 1 switches during the t2 and t3 transitions, which means that it is necessary to optimize the internal potentials of these transistors. A 1/0/1 transition allows the subcell CEL 1 to be optimized. It is then necessary to extract the internal potentials of the transistors in the dynamic equilibrium state corresponding to the 0/1/0 transition and inject them as initial parameters into an optimization of the internal potentials of the transistors MN3, MN4, MN5, MP3, MP4 and MP5, where: a=0 and b=0/1/0 for the t3 transition; and b=0 and a=0/1/0 for the t2 transition.

That which is claimed is:

1. A method for designing a silicon-on-insulator (SOI) type complementary metal oxide semiconductor (CMOS) device comprising:
    modeling a CMOS logic cell comprising at least one complementary transistor pair, each transistor comprising a respective floating substrate; and
    determining desired internal potentials of the transistors of the modeled CMOS logic cell in a dynamic equilibrium state by
        simulating operation of the modeled CMOS logic cell based upon initial internal potentials using a transitioning binary stimulation signal, and
        determining a point of cancellation of charge variations in the floating substrates of the transistors based upon a sum of the squares of the charge variations over a plurality of transitions of the stimulation signal.

2. The method of claim 1 wherein determining the point of cancellation comprises determining the point of cancellation to within a precision error.

3. The method of claim 1 wherein simulating comprises iteratively simulating operation of the modeled CMOS logic cell; and wherein determining the point of cancellation comprises changing the initial internal potentials between iterations so that the sum of the squares approaches the point of cancellation.

4. The method of claim 1 wherein determining the desired internal potentials further comprises determining the charge variations by:
    determining the internal potentials of the floating substrates during a static equilibrium state of the modeled CMOS logic cell; and
    determining a difference between respective rates of change of the internal potentials of the floating substrates between the static equilibrium state and the dynamic equilibrium state.

5. The method of claim 1 wherein determining the desired internal potentials further comprises determining the charge variations by:
    determining internal potentials of the transistors of the cell after each of the plurality of transitions of the stimulation signal; and
    designating at least one of best and worse case internal potentials from among the determined internal potentials for the transistors corresponding to best and worse case time delays, respectively, and determining the initial internal potentials based thereon.

6. The method of claim 5 wherein designating at least one of the best and worse case internal potentials comprises:
    determining a rate of change between a first internal potential and an internal potential at the dynamic equilibrium state of a first one of the transistors; and
    determining the initial internal potential of a second one of the transistors for at least one of the best and worse case time delays from the internal potential of the first transistor in at least one of its static and dynamic equilibrium states based upon the determined rate of change.

7. The method of claim 1 wherein the CMOS logic cell comprises at least one input connected to the transistors, and wherein the stimulation signal is applied to the at least one input.

8. The method of claim 1 wherein the at least one pair of complementary transistors comprises a plurality of complementary transistor pairs.

9. The method of claim 8 wherein the CMOS logic cell comprises a plurality of inputs connected to the plurality of complementary transistor pairs; and wherein the stimulation signal is successively applied to each of the inputs while at least one predetermined signal is applied to the other inputs.

10. The method of claim 8 wherein the plurality of complementary transistor pairs are grouped into a plurality of subcells; and wherein determining the desired internal potentials comprises determining the desired internal potentials of the transistors of each subcell in the dynamic equilibrium state.

11. A method for designing a partially depleted silicon-on-insulator (PD-SOI) type complementary metal oxide semiconductor (CMOS) device comprising:
    modeling a CMOS logic cell comprising at least one complementary transistor pair, each transistor comprising a respective floating substrate; and
    determining desired internal potentials of the transistors of the modeled CMOS logic cell in a dynamic equilibrium state by
        iteratively simulating operation of the modeled CMOS logic cell beginning with initial internal potentials using a transitioning binary stimulation signal, and determining a point of cancellation of charge variations in the floating substrates of the transistors to within a precision error based upon a sum of the squares of the charge variations over a plurality of transitions of the stimulation signal by changing the initial internal potentials between simulation iterations so that the sum of the squares approaches the point of cancellation.

12. The method of claim 11 wherein determining the desired internal potentials further comprises determining the charge variations by:
   determining the internal potentials of the floating substrates during a static equilibrium state of the modeled CMOS logic cell; and
   determining a difference between respective rates of change of the internal potentials of the floating substrates between the static equilibrium state and the dynamic equilibrium state.

13. The method of claim 11 wherein determining the desired internal potentials further comprises determining the charge variations by:
   determining internal potentials of the transistors of the cell after each of the plurality of transitions of the stimulation signal; and
   designating at least one of best and worse case internal potentials from among the determined internal potentials for the transistors corresponding to best and worse case time delays, respectively, and determining the initial internal potentials based thereon.

14. The method of claim 13 wherein designating at least one of the best and worse case internal potentials comprises:
   determining a rate of change between a first internal potential and an internal potential at the dynamic equilibrium state of a first one of the transistors; and
   determining the initial internal potential of a second one of the transistors for at least one of the best and worse case time delays from the internal potential of the first transistor in at least one of its static and dynamic equilibrium states based upon the determined rate of change.

15. The method of claim 11 wherein the at least one pair of complementary transistors comprises a plurality of complementary transistor pairs.

16. The method of claim 15 wherein the CMOS logic cell comprises a plurality of inputs connected to the plurality of complementary transistor pairs; and wherein the stimulation signal is successively applied to each of the inputs while at least one predetermined signal is applied to the other inputs.

17. The method of claim 15 wherein the plurality of complementary transistor pairs are grouped into a plurality of subcells; and wherein determining the desired internal potentials comprises determining the desired internal potentials of the transistors of each subcell in the dynamic equilibrium state.

18. A system for designing a silicon-on-insulator (SOI) type device comprising:
   a modeled complementary metal oxide semiconductor (CMOS) logic cell comprising at least one complementary transistor pair, each transistor comprising a respective floating substrate; and
   a processor for determining desired internal potentials of said transistors of said modeled CMOS logic cell in a dynamic equilibrium state by
      simulating operation of said modeled CMOS logic cell based upon initial internal potentials using a transitioning binary stimulation signal, and
      determining a point of cancellation of charge variations in the floating substrates of said transistors based upon a sum of the squares of the charge variations over a plurality of transitions of the stimulation signal.

19. The system of claim 18 wherein said processor determines the point of cancellation to within a precision error.

20. The system of claim 18 wherein said processor iteratively simulates operation of said modeled CMOS logic cell and determines the point of cancellation by changing the initial internal potentials between iterations so that the sum of the squares approaches the point of cancellation.

21. The system of claim 18 wherein said processor determines the charge variations by:
   determining the internal potentials of the floating substrates during a static equilibrium state of said modeled CMOS logic cell; and
   determining a difference between respective rates of change of the internal potentials of the floating substrates between the static equilibrium state and the dynamic equilibrium state.

22. The system of claim 18 wherein said processor determines the charge variations by:
   determining internal potentials of the transistors of the cell after each of the plurality of transitions of the stimulation signal; and
   designating at least one of best and worse case internal potentials from among the determined internal potentials for the transistors corresponding to best and worse case time delays, respectively, and determining the initial internal potentials based thereon.

23. The system of claim 22 wherein said processor designates the at least one of the best and worse case internal potentials by:
   determining a rate of change between a first internal potential and an internal potential at the dynamic equilibrium state of a first one of said transistors; and
   determining the initial internal potential of a second one of said transistors for at least one of the best and worse case time delays from the internal potential of said first transistor in at least one of its static and dynamic equilibrium states based upon the determined rate of change.

24. The system of claim 18 wherein said modeled CMOS logic cell comprises at least one input connected to said transistors, and wherein the stimulation signal is applied to the at least one input.

25. The system of claim 18 wherein said at least one pair of complementary transistors comprises a plurality of complementary transistor pairs.

26. The system of claim 25 wherein said modeled CMOS logic cell comprises a plurality of inputs connected to said plurality of complementary transistor pairs; and wherein the stimulation signal is successively applied to each of the inputs while at least one predetermined signal is applied to the other inputs.

27. The system of claim 25 wherein said plurality of complementary transistor pairs are grouped into a plurality of subcells; and wherein said processor determines the desired internal potentials of said transistors of each subcell in the dynamic equilibrium state.

* * * * *